(12) United States Patent
Kim et al.

(10) Patent No.: US 7,295,076 B2
(45) Date of Patent: Nov. 13, 2007

(54) SYNCHRONOUSLY COUPLED OSCILLATOR

(75) Inventors: Beomsup Kim, Cupertino, CA (US); Ozan Erdogan, Campbell, CA (US); Dennis G. Yee, San Francisco, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 11/301,859

(22) Filed: Dec. 12, 2005

(65) Prior Publication Data

US 2006/0091966 A1    May 4, 2006

Related U.S. Application Data

(63) Continuation of application No. 10/101,560, filed on Mar. 18, 2002, now Pat. No. 7,005,930, which is a continuation-in-part of application No. 10/004,521, filed on Nov. 14, 2001, now Pat. No. 6,900,699.

(51) Int. Cl.
*H03L 7/00* (2006.01)
(52) U.S. Cl. .............................. 331/2; 331/55; 331/167; 331/108 C
(58) Field of Classification Search .................... 331/2, 331/45, 46, 55, 108 C, 167
See application file for complete search history.

(56) References Cited

U.S. PATENT DOCUMENTS

| | | | |
|---|---|---|---|
| 3,731,230 A | 5/1973 | Cerny, Jr. | |
| 4,940,939 A * | 7/1990 | Khait et al. | 324/236 |
| 5,561,399 A | 10/1996 | Haartsen | |
| 5,635,877 A | 6/1997 | Monk et al. | |
| 5,852,385 A | 12/1998 | Izumikawa | |
| 5,892,425 A | 4/1999 | Kuhn et al. | |
| 6,094,103 A | 7/2000 | Jeong et al. | |
| 6,104,253 A | 8/2000 | Hall et al. | |
| 6,232,847 B1 | 5/2001 | Marcy et al. | |
| 6,433,653 B1 | 8/2002 | Matsumura et al. | |
| 6,717,478 B1 | 4/2004 | Kim et al. | |

FOREIGN PATENT DOCUMENTS

| | | |
|---|---|---|
| EP | 0900997 | 8/1998 |
| KR | 10-268050 | 7/2000 |
| KR | 10-0278551 | 10/2000 |

OTHER PUBLICATIONS

Department of Physics and Astronomy: Georgia State University; *Mutual Inductance*: downloaded Apr. 8, 2005, http://hyperphysics.phy-astr.gsu.edu/hbase/magnetic/indmut.html.
Department of Physics and Astronomy: Georgia State University; *Electric Voltage*: downloaded Apr. 8, 2005, http://hyperphysics.phy-astr.gsu.edu/hbase/electric/elevol.html#c2.

(Continued)

*Primary Examiner*—Arnold Kinkead
(74) *Attorney, Agent, or Firm*—Diana Y. Fu; William Marcus Hooks; Thomas Rouse

(57) ABSTRACT

A phase synchronous multiple LC tank oscillator is described. A plurality of oscillator stages are configured to oscillate synchronously. The phase of each of the plurality of oscillator stages is substantially the same and the plurality of oscillators are inductively coupled.

25 Claims, 11 Drawing Sheets

OTHER PUBLICATIONS

Department of Physics and Astronomy: Georgia State University; *Faraday's Law*: downloaded Apr. 8, 2005, http://hyperphysics.phy-astr.gsu.edu/hbase/electric/farlaw.html#cl.

Kim, Jae Joon; Kim,Beomsup; "A Low-Phase-Noise CMOS LC Oscillator With a Ring Structure", 2000, IEEE International Solid-State Circuits Conference; 07803-5853-8/00.

* cited by examiner

SYNCHRONOUSLY COUPLED OSCILLATOR

CROSS REFERENCE TO OTHER APPLICATIONS

This application is a continuation of U.S. patent application Ser. No. 10/101,560, which issued as U.S. Pat. No. 7,005,930, entitled SYNCHRONOUSLY COUPLED OSCILLATOR filed Mar. 18, 2002, which is incorporated herein by reference for all purposes, which is a continuation in part of U.S. patent application Ser. No. 10/004,521, which issued as U.S. Pat. No. 6,900,699, entitled PHASE SYNCHRONOUS MULTIPLE LC TANK OSCILLATOR filed Nov. 14, 2001, which is incorporated herein by reference for all purposes.

BACKGROUND OF THE INVENTION

The present invention relates generally to voltage controlled oscillators (VCO's). An inductively coupled oscillator is disclosed.

VCO's are commonly used in communication systems, as well as other applications. Multiple oscillators may be cascaded in a ring to improve noise and performance and may be configured with various different phase relationships among the oscillators in the cascade. Kim, which was previously incorporated by reference, discloses a VCO that includes multiple oscillators configured to oscillate synchronously, in phase with each other. The oscillators are electrically coupled to cause the synchronous oscillation. Because the oscillators oscillate in phase, it is possible to arrange the inductors that are included in the oscillators so that the inductors are mutually inductive.

One of the ways that noise is introduced into a cascaded oscillator is through the wires and switches that comprise the electrical connections between oscillators that couple the oscillators and cause synchronous oscillation. It would be useful if such noise could be reduced. Furthermore, it would be useful if improved coupling schemes for synchronous oscillator cascades could be developed and if improved inductor layout schemes could be developed for inductors configured to be mutually inductive.

BRIEF DESCRIPTION OF THE DRAWINGS

Various embodiments of the invention are disclosed in the following detailed description and the accompanying drawings.

The present invention will be readily understood by the following detailed description in conjunction with the accompanying drawings, wherein like reference numerals designate like structural elements, and in which.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1A:
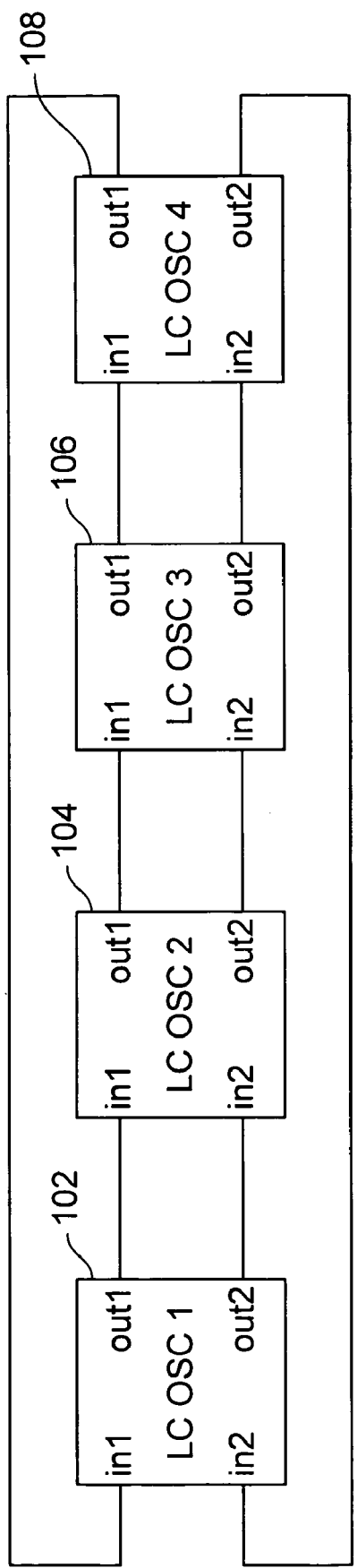
FIG. 1A is a block diagram illustrating an electrically coupled phase synchronous LC tank oscillator.
Figure 2:
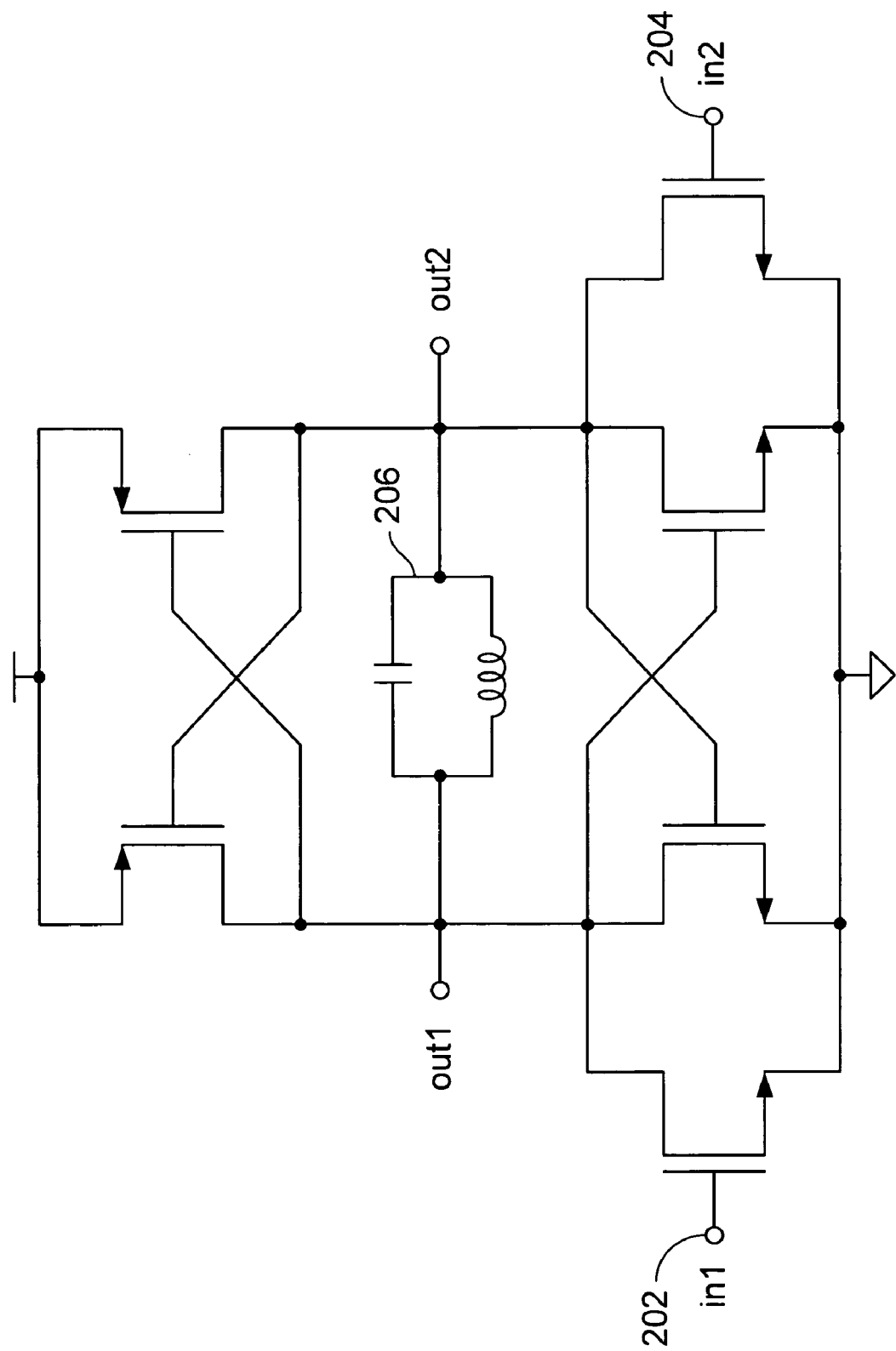
FIG. 2 is a diagram illustrating an LC tank oscillator.

FIG. 1A is a block diagram illustrating an electrically coupled phase synchronous LC tank oscillator. Each oscillator stage, 102, 104, 106, and 108 includes a pair of inputs and a pair of outputs. A preferred design for each oscillator stage is shown in FIG. 2. Each output is connected to an input of the next oscillator in the chain. This configuration results in each of the oscillators oscillating in a synchronous manner.

Figure 1B:
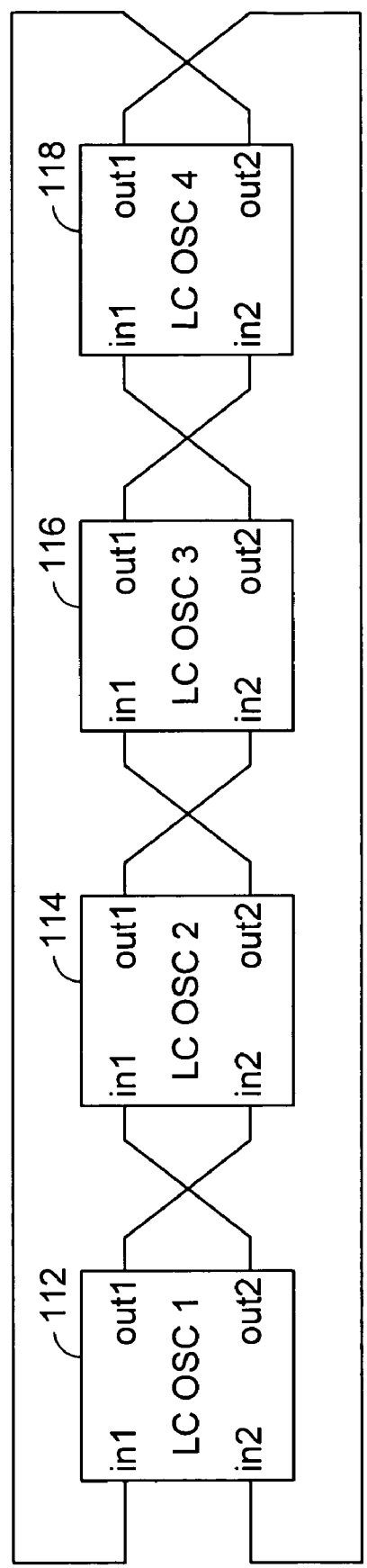
FIG. 1B is a block diagram illustrating an alternate design for an electrically coupled phase synchronous oscillator.

FIG. 1B is a block diagram illustrating an alternate design for an electrically coupled phase synchronous oscillator. Each oscillator stage, 112, 114, 116, and 118 includes a pair of inputs and a pair of outputs. A preferred design for each of the LC tank oscillators is shown in FIG. 2. Each output is connected to an input of the next oscillator in the chain, with a different input selected than the input selected in FIG. 1. This configuration results in each of the oscillators oscillating in a synchronous manner.

Figure 1C:
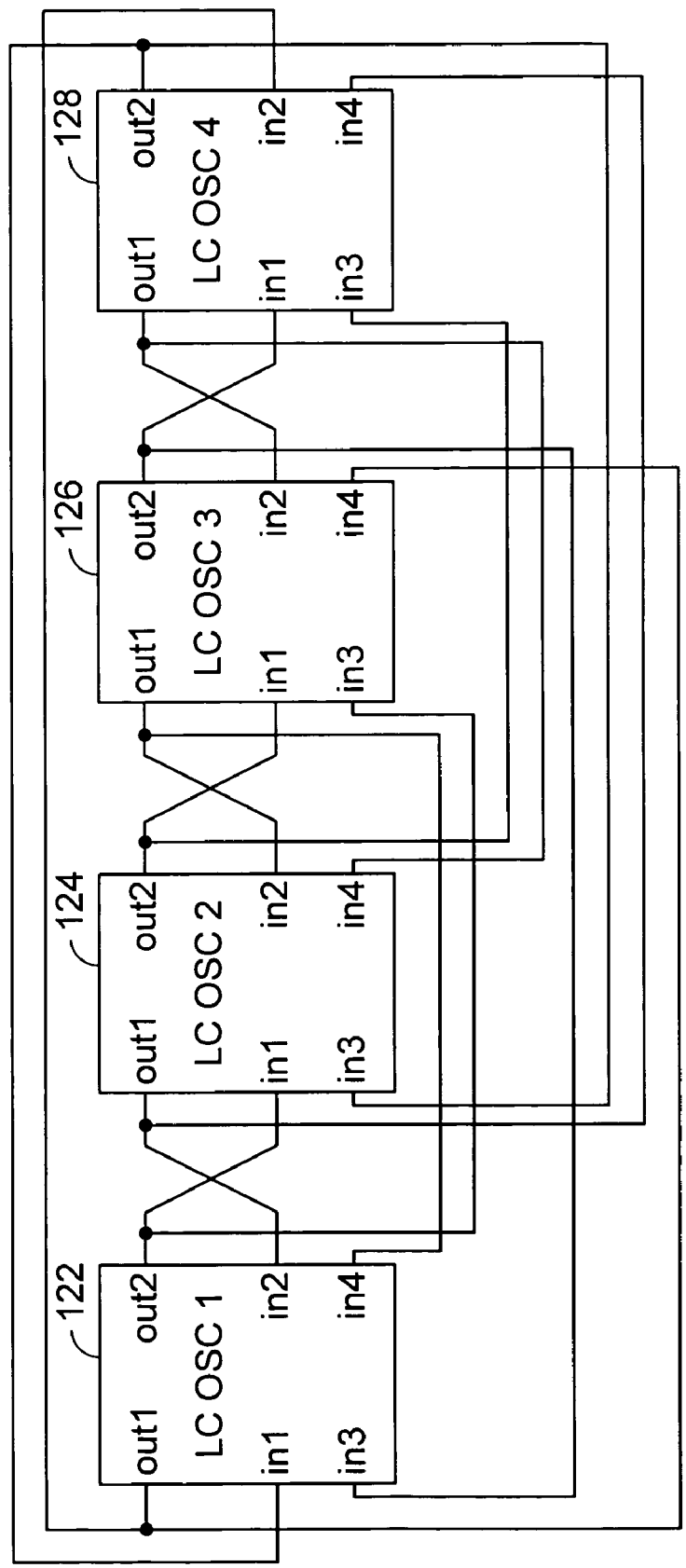
FIG. 1C is a diagram illustrating another LC tank oscillator architecture that utilizes four oscillator stages that oscillate synchronously.

FIG. 1C is a diagram illustrating another LC tank oscillator architecture that utilizes four oscillator stages, 122, 124, 126, and 128 that oscillate synchronously. Each oscillator stage includes four inputs and two outputs. The inputs and outputs are again configured to cause the oscillator stages to oscillate in phase.

FIG. 2 is a diagram illustrating an LC tank oscillator. LC tank oscillator 200 includes input node 202 and input node 204. The input nodes are coupled to the LC portion of the circuit 206 via a network of transistors. Because the individual LC tank oscillators oscillate synchronously, the inductors may be configured in a mutually inductive manner. Each inductor is laid out so that the area in which its flux is contained substantially coexists with the flux area of the other inductors that comprise the other oscillators in the ring.

Figure 3A:
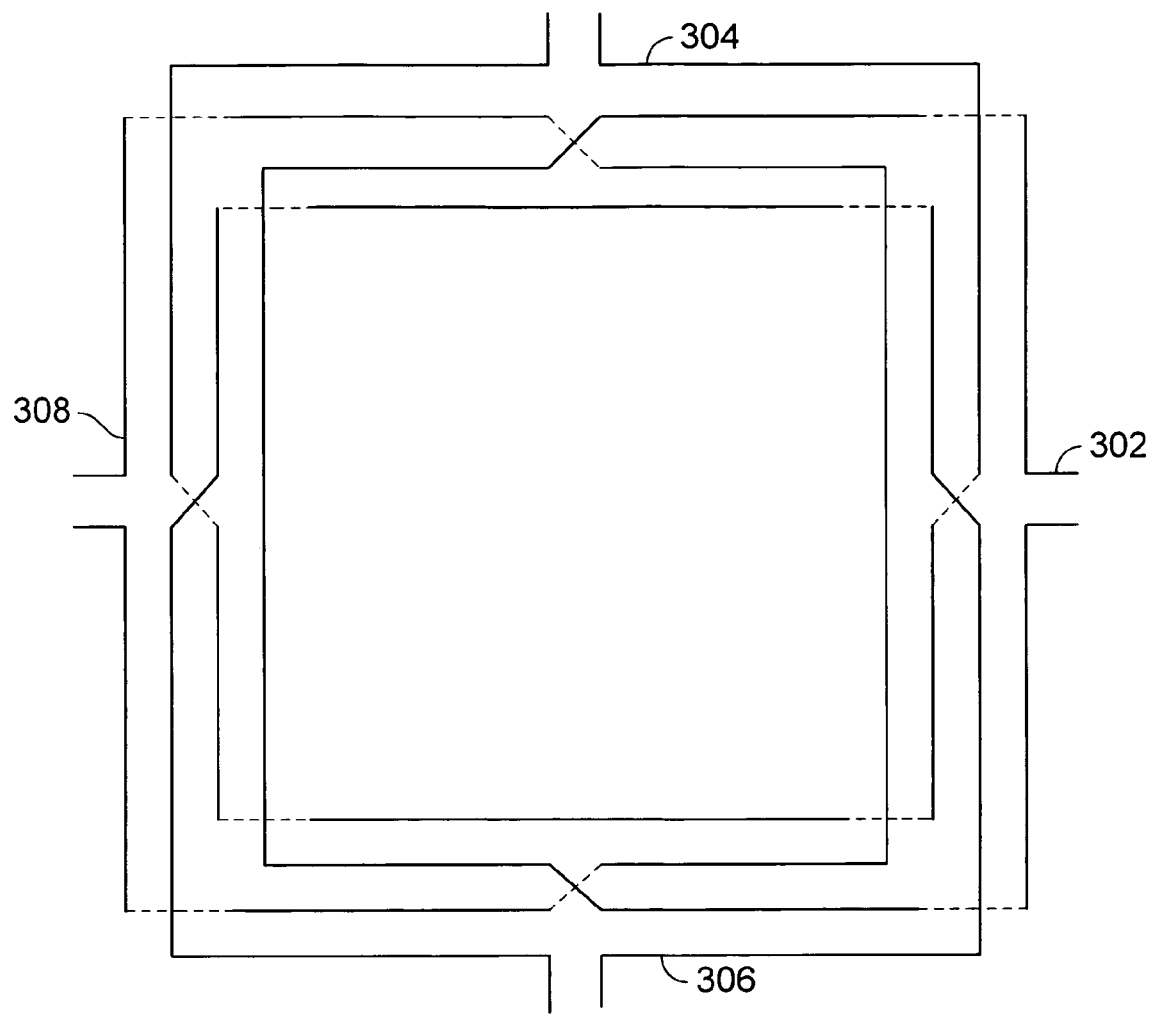
FIG. 3A is a diagram illustrating a rectangular physical layout for 4 inductors that are mutually inductive.

FIG. 3A is a diagram illustrating a rectangular physical layout for 4 inductors that are mutually inductive in the manner described above. The layout includes inductors 302, 304, 306 and 308. The layout is symmetric and the flux area of the inductors substantially overlaps. Dashed lines are used to illustrate when one inductor wire drops to a lower layer to pass under another inductor wire. This layout is implemented using a multilayer metal structure as described in FIG. 3D. Each conductor that forms a loop begins at a first upper layer, then transitions to a second lower layer to pass under another inductor when that is required and then transitions back to the first layer.

Figure 3B:
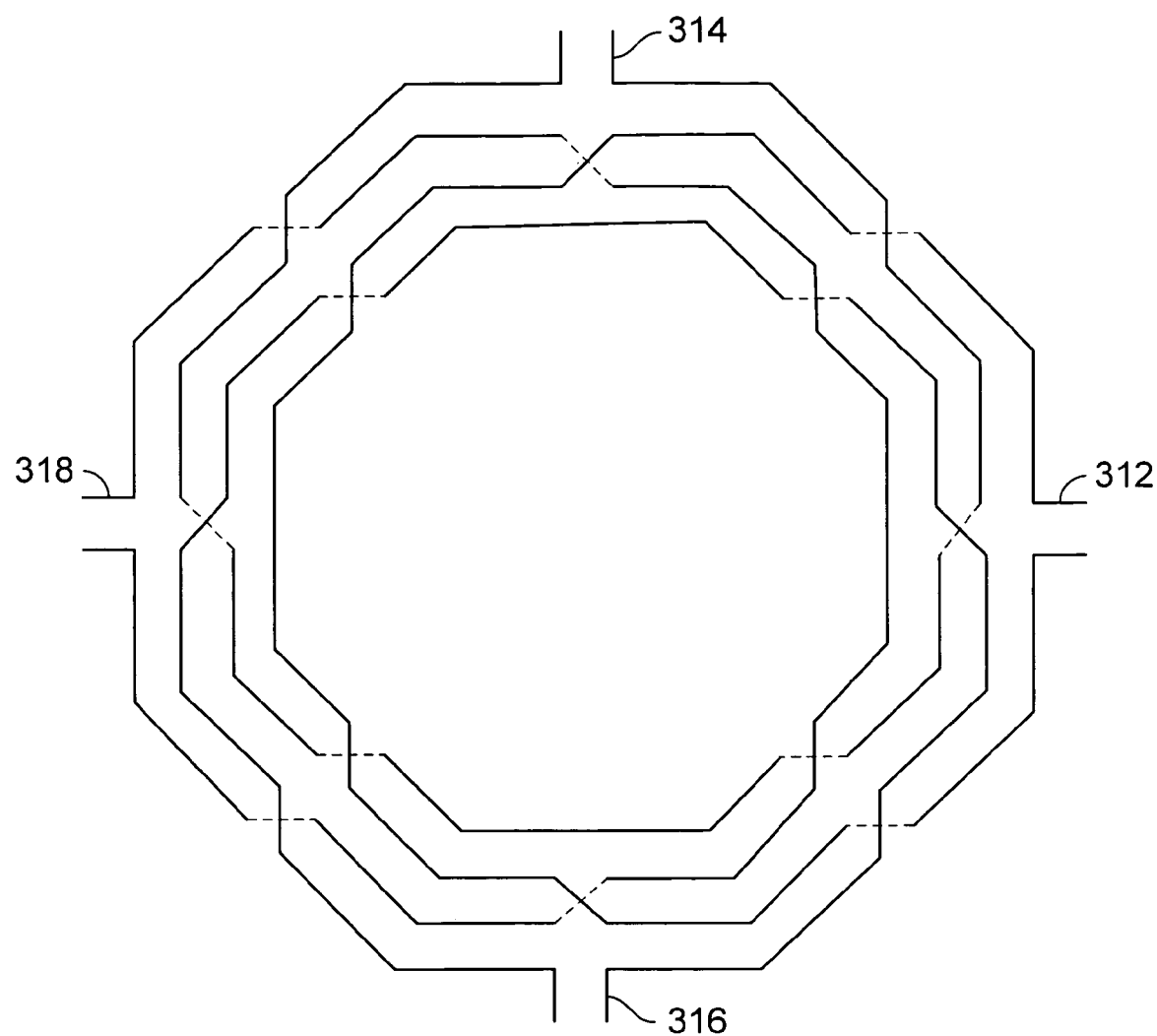
FIG. 3B is a diagram illustrating an octagonal physical layout for 4 inductors that are mutually inductive.

FIG. 3B is a diagram illustrating an octagonal physical layout for 4 inductors that are mutually inductive in the manner described above. The layout includes inductors 312, 314, 316 and 318. The layout is symmetric and the flux area of the inductors substantially overlaps. Dashed lines are used to illustrate when one line passes under another line. This layout is implemented using a multilayer metal structure as described in FIG. 3D. The octagonal layout shown has the advantage that the angle of the turns is less acute, which reduces current crowding.

Figure 3C:
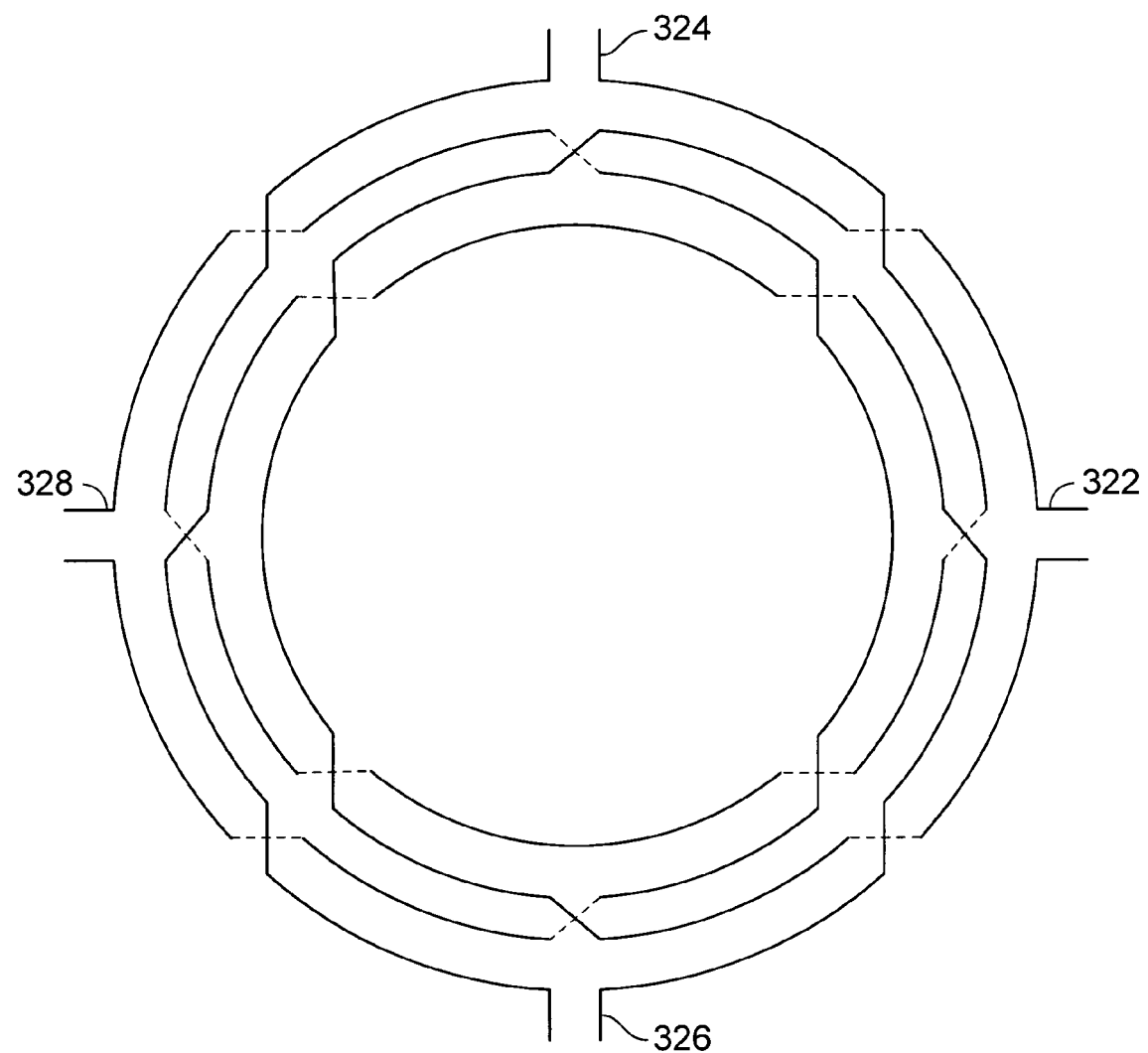
FIG. 3C is a diagram illustrating a circular layout for 4 inductors that are mutually inductive.

FIG. 3C is a diagram illustrating a circular layout for 4 inductors that are mutually inductive in the manner described above. The layout includes inductors 322, 324, 326 and 328. The layout is symmetric and the flux area of the inductors substantially overlaps. Dashed lines are used to illustrate when one line passes under another line. This layout is implemented using a multilayer metal structure as described in FIG. 3D. The circular layout shown has the advantage eliminating the angular turns, which reduces current crowding.

Figure 3D:
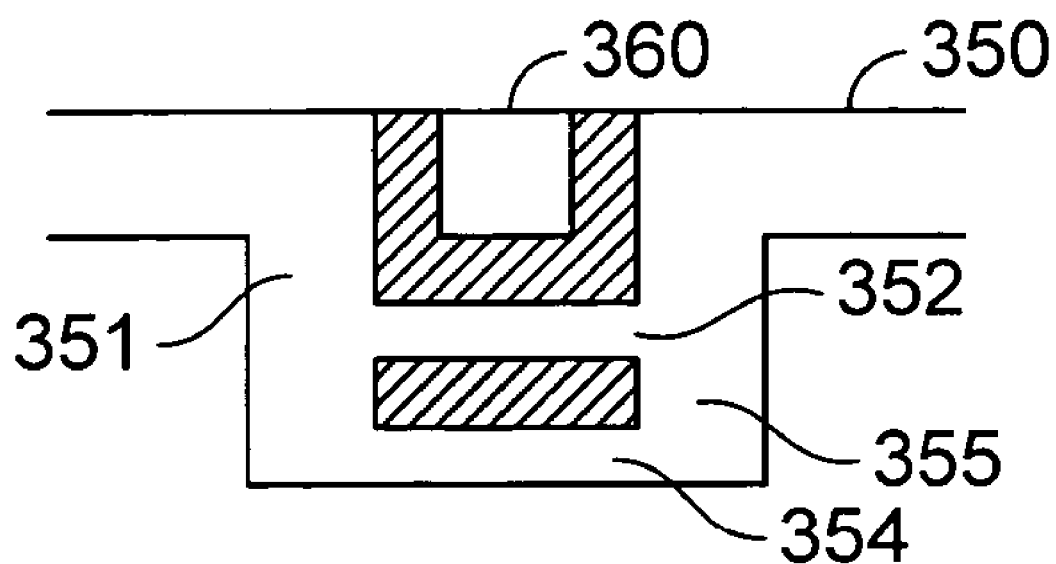
FIG. 3D is a diagram illustrating in detail how one inductor passes below another inductor at a crossing point.

FIG. 3D is a diagram illustrating in detail how one inductor passes below another inductor at a crossing point. Preferably, the inductors are laid out on a top metal layer. Depending on the manufacturing process, the top metal layer may be thicker (on the order of two or three times thicker in some embodiments) than the second layer that is just below the top layer. When the top layer is thicker than the lower layers, the lower layers tend to have higher resistance. This problem can be ameliorated by connecting the top layer to two or more lower layers in parallel. At a crossing point, one inductor is interrupted in the top layer and is connected to one or more lower layers using one or more vias. Once the crossing point has passed, the inductor resumes on the top layer and one or more vias connect the lower layers to the top layer.

In the example shown, inductor 350 is disposed in the top layer until a crossing point with inductor 360 is reached. Inductor 350 is interrupted in the top layer and is connected to the second layer and the third layer by via 351. Second layer portion 352 and third layer portion 354 of inductor 350 run below inductor 360. Once the crossing point is passed, via 355 connects second layer portion 352 and third layer portion 354 back to the top layer and inductor 350 resumes on the top layer. In different embodiments, different numbers of layers may be used. In general, only 2 layers are required, but additional layers may be used to lower the resistance of the portion of the inductor that drops down to a lower layer.

In addition to the disclosed architectures using 4 oscillator stages, other 4 oscillator stage architectures may be used as well as architectures having different numbers of oscillators.

Figure 4A:
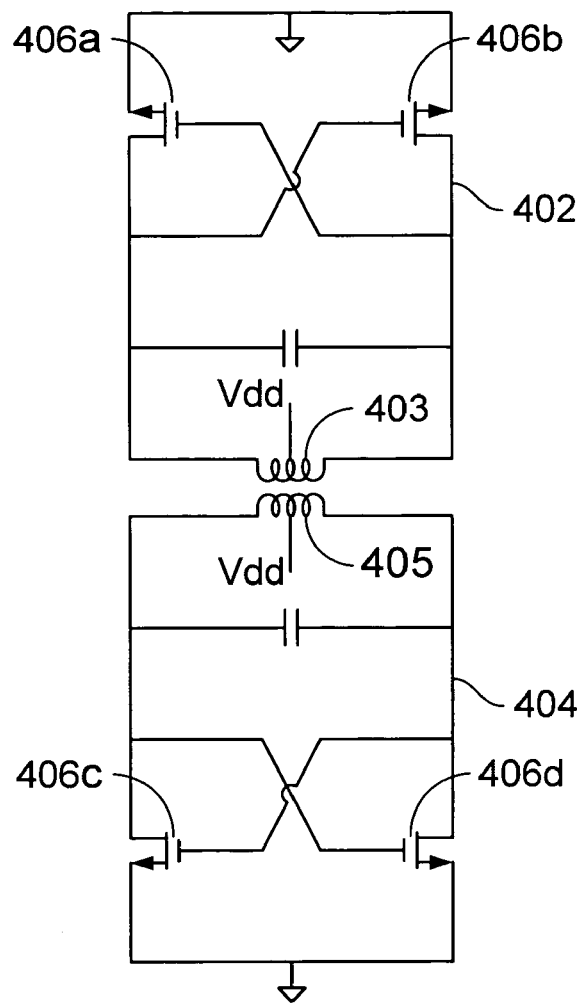
FIG. 4A is a diagram illustrating a 2 oscillator stage synchronous LC tank oscillator where the oscillators are inductively coupled without electrical coupling.

FIG. 4A is a diagram illustrating a 2 oscillator stage synchronous LC tank oscillator where the oscillators are inductively coupled without electrical coupling. Oscillator 402 and oscillator 404 are inductively coupled through their inductors 403 and 405. Each of the inductors includes a center tap that is connected to a bias voltage Vdd. The inductive coupling causes the oscillator stages to oscillate synchronously without electrical coupling. By replacing electrical coupling with inductive coupling, the noise associated with the electrical coupling circuit is eliminated.

Figure 4B:
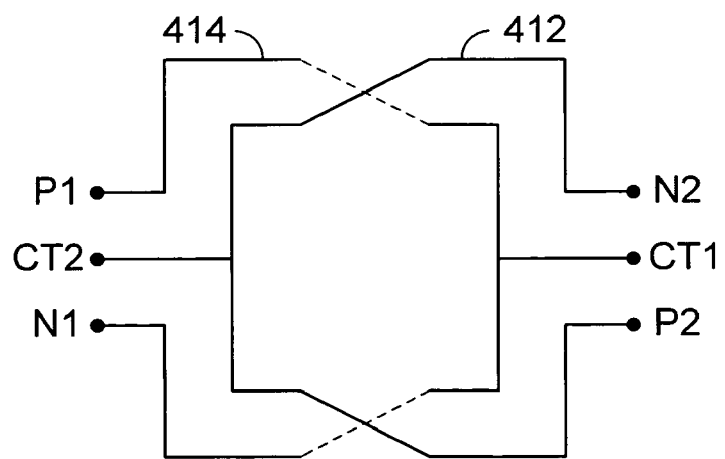
FIG. 4B is a diagram illustrating a layout for 2 inductors that are mutually inductive.

FIG. 4B is a diagram illustrating a layout for 2 inductors that are mutually inductive in the manner described above. The inductors are laid out on a top layer with inductor 414 dropping down to a lower layer in order to cross under inductor 412 at the appropriate point. Each inductor includes a center tap. The area in which the magnetic flux is contained for each inductor substantially coexists with the flux area of the other inductor. In other embodiments, different shaped inductors are used, such as the hexagonal shape and circular shape shown above.

Figure 4C:
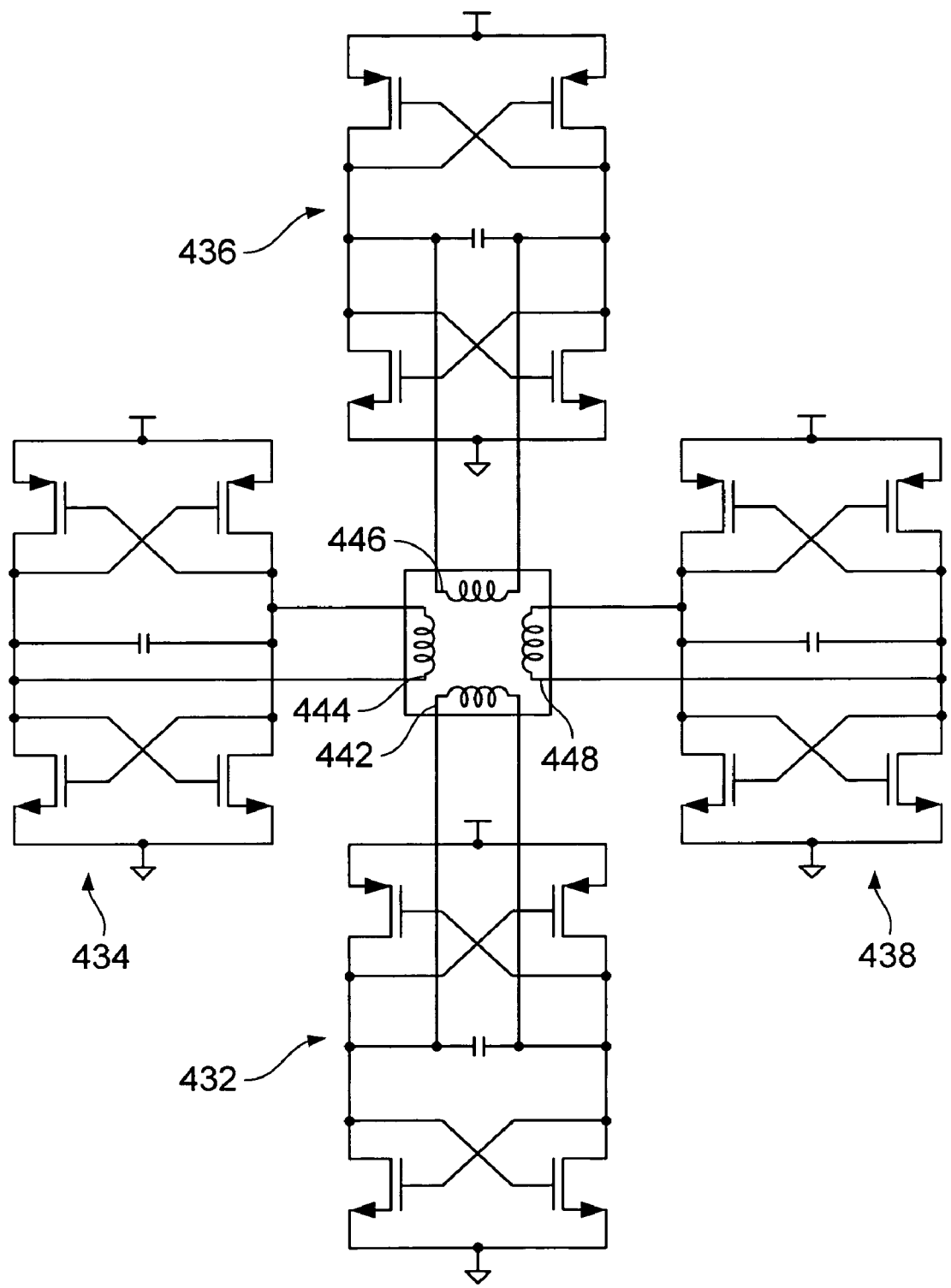
FIG. 4C is a diagram illustrating a 4 oscillator stage synchronous LC tank oscillator where the oscillators are inductively coupled without electrical coupling.

FIG. 4C is a diagram illustrating a 4 oscillator stage synchronous LC tank oscillator where the oscillators are inductively coupled without electrical coupling. Oscillators 432, 434, 436, and 438 are inductively coupled through their inductors 442, 444, 446, and 448. The inductors are disposed in a manner as shown in FIGS. 3A-3C so that the areas in which flux is contained substantially overlap. The inductive coupling causes the oscillator stages to oscillate synchronously without electrical coupling. By replacing electrical coupling with inductive coupling, the noise associated with the electrical coupling circuit is eliminated.

Figure 5:
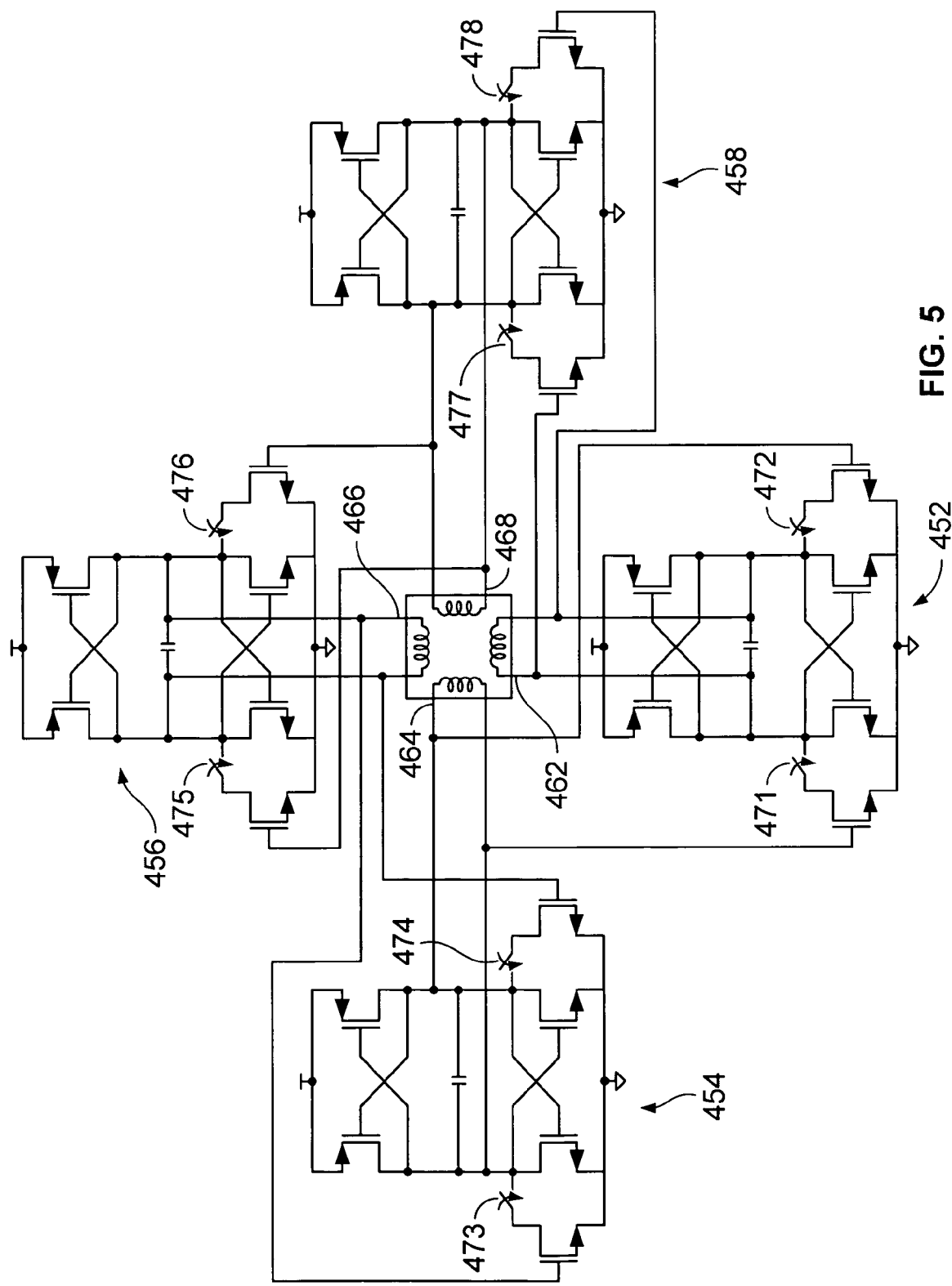
FIG. 5 is a diagram illustrating a 4 oscillator stage synchronous LC tank oscillator where the oscillators are inductively coupled with electrical coupling selectively included and controlled by a set of switches.

FIG. 5 is a diagram illustrating a 4 oscillator stage synchronous LC tank oscillator where the oscillators are inductively coupled with electrical coupling selectively included and controlled by a set of switches. Electrical coupling is selectively connected or disconnected using the switches. Oscillators 452, 454, 436, and 438 are inductively coupled through their inductors 462, 464, 466, and 468. Switches 471, 472, 473, 475, 476, 477, and 478 selectively connect or disconnect electrical coupling among the oscillators. The inductors are disposed in a manner as shown in FIGS. 3A-3C so that the areas in which flux is contained substantially overlap. When the electrical coupling is deactivated using the switches, the inductive coupling causes the oscillator stages to oscillate synchronously without electrical coupling. By replacing electrical coupling with inductive coupling, the noise associated with the electrical coupling circuit is eliminated. A number of embodiments of LC tank oscillators have been described that include coupled inductors. In some embodiments, two or more oscillators are synchronized using inductive coupling without electrical coupling or with reduced electrical coupling. The synchronous coupling improves the phase noise of the oscillators. Also, the inductive coupling increases the Q, which improves the phase noise. Lower phase noise for the same power or lower power for the same phase noise is achieved compared to non-synchronous oscillators. The coupled inductors occupy less area since they overlap. Several embodiments of exemplary overlapping inductor layouts have been illustrated.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A phase synchronous multiple LC tank oscillator comprising:
a plurality of oscillator stages configured to oscillate synchronously wherein the phase of each of the plurality of oscillator stages is substantially the same and wherein a first one of the plurality of oscillator stages includes a first inductor and is inductively coupled to a second one of the plurality of oscillator stages which includes a second inductor, the first inductor and second inductor are disposed on a top layer of an integrated circuit, wherein at a crossing point with the second inductor, a portion of the first inductor is disposed on at least one layer below the top layer and the portion of the first inductor returns to the top layer after the crossing point.

2. A phase synchronous multiple LC tank oscillator as recited in claim 1 wherein the synchronous oscillation is substantially caused by magnetic coupling.

3. A phase synchronous multiple LC tank oscillator as recited in claim 1 wherein the synchronous oscillator stages are not substantially electrically coupled.

4. A phase synchronous multiple LC tank oscillator as recited in claim 1 wherein the synchronous oscillator stages are coupled electrically during a first time period and the electrical coupling is disconnected during a second time period.

5. A phase synchronous multiple LC tank oscillator as recited in claim 1 wherein the synchronous oscillator stages are coupled electrically during a first time period and the electrical coupling is reduced during a second time period.

6. A phase synchronous multiple LC tank oscillator as recited in claim 1 wherein the plurality of oscillator stages includes four oscillator stages.

7. A phase synchronous multiple LC tank oscillator as recited in claim 1 wherein the plurality of oscillator stages includes two oscillator stages.

8. A phase synchronous multiple LC tank oscillator as recited in claim 1 wherein the inductive coupling is achieved using two center tapped inductors.

9. A phase synchronous multiple LC tank oscillator as recited in claim 1 wherein the inductive coupling is achieved using inductors that are mutually inductive.

10. A phase synchronous multiple LC tank oscillator as recited in claim 1 wherein the inductive coupling is achieved using inductors having areas in which flux is contained that substantially coexist.

11. A phase synchronous multiple LC tank oscillator as recited in claim 1 wherein at least one of the oscillator stages includes a switch.

12. A phase synchronous multiple LC tank oscillator as recited in claim 1 wherein the phase synchronous multiple LC tank oscillator is used in a wireless transceiver.

13. A multiple LC tank oscillator including:
a first oscillator stage having a first inductor; and
a second oscillator stage having a second inductor;
wherein the first inductor and the second inductor are mutually inductive, the first inductor and the second inductor are disposed on a top layer of an integrated circuit, wherein at a crossing point with the second inductor, a portion of the first inductor is disposed on at least one layer below the top layer and the portion of the first inductor returns to the top layer after the crossing point.

14. A multiple LC tank oscillator as recited in claim 13 wherein the first inductor and second inductor are disposed such that the flux areas surrounded by the inductors overlap.

15. A multiple LC tank oscillator as recited in claim 13 wherein the first inductor and second inductor are disposed on two layers of an integrated circuit.

16. A multiple LC tank oscillator as recited in claim 13 wherein the first inductor and second inductor are disposed on three layers of an integrated circuit.

17. A multiple LC tank oscillator as recited in claim 13 wherein the portion of the first inductor is disposed on at least two layers below a layer that includes the second inductor.

18. A multiple LC tank oscillator as recited in claim 13 wherein the first inductor and second inductor each are arranged in a hexagonal shape.

19. A multiple LC tank oscillator as recited in claim 13 wherein the first inductor and second inductor each are arranged in a circular shape.

20. A multiple LC tank oscillator as recited in claim 13 wherein the first inductor drops down to a second layer when the first inductor and the second inductor cross.

21. A multiple LC tank oscillator as recited in claim 13 wherein the first inductor and second inductor are disposed in at most two layers of an integrated circuit.

22. A multiple LC tank oscillator as recited in claim 13 further including:
a third oscillator stage having a third inductor; and
a fourth oscillator stage having a fourth inductor;
wherein the first inductor, the second inductor, the third inductor, and the fourth inductor are all mutually inductive.

23. A multiple LC tank oscillator as recited in claim 13 further including:
a third oscillator stage having a third inductor; and
a fourth oscillator stage having a fourth inductor;
wherein the first inductor, the second inductor, the third inductor, and the fourth inductor are all mutually inductive and wherein the one of the inductors drops down to a second layer when two of the inductors cross.

24. A multiple LC tank oscillator as recited in claim 13 further including:
a third oscillator stage having a third inductor; and
a fourth oscillator stage having a fourth inductor;
wherein the first inductor, the second inductor, the third inductor, and the fourth inductor are all mutually inductive and wherein the first inductor, the second inductor, the third inductor and the fourth inductor are disposed on two layers of an integrated circuit.

25. A multiple LC tank oscillator as recited in claim 13 wherein the first oscillator stage includes a switch.

* * * * *